(12) United States Patent
Gates et al.

(10) Patent No.: US 8,455,846 B2
(45) Date of Patent: Jun. 4, 2013

(54) METHOD FOR MAKING STRUCTURES WITH IMPROVED EDGE DEFINITION

(75) Inventors: Brian J. Gates, Osceola, WI (US); Robert T. Krasa, Hudson, WI (US); Przemyslaw P. Markowicz, Woodbury, MN (US); Craig R. Sykora, New Richmond, WI (US); Robert J. DeVoe, Arden Hills, MN (US); Dean Faklis, Wayland, NY (US)

(73) Assignee: 3M Innovative Properties Company, Saint Paul, MN (US)

( * ) Notice: Subject to any disclaimer, the term of this patent is extended or adjusted under 35 U.S.C. 154(b) by 317 days.

(21) Appl. No.: 12/746,888

(22) PCT Filed: Nov. 6, 2008

(86) PCT No.: PCT/US2008/082588
§ 371 (c)(1),
(2), (4) Date: Aug. 5, 2010

(87) PCT Pub. No.: WO2009/075970
PCT Pub. Date: Jun. 18, 2009

(65) Prior Publication Data
US 2010/0294954 A1     Nov. 25, 2010

Related U.S. Application Data

(60) Provisional application No. 61/013,121, filed on Dec. 12, 2007.

(51) Int. Cl.
*H01L 21/027* (2006.01)
(52) U.S. Cl.
USPC ..................................... 250/492.1

(58) Field of Classification Search
USPC ..................................... 250/492.1
See application file for complete search history.

(56) References Cited

U.S. PATENT DOCUMENTS

| 3,018,262 | A | 1/1962 | Schroeder |
| 3,729,313 | A | 4/1973 | Smith |
| 3,741,769 | A | 6/1973 | Smith |
| 3,779,778 | A | 12/1973 | Smith |

(Continued)

FOREIGN PATENT DOCUMENTS

| EP | 841140 | 5/1998 |
| EP | 856592 | 8/1998 |

(Continued)

OTHER PUBLICATIONS

"Microlenslet Array Based Magnifying System," Shaoulov, Breault Research Organization, Inc., Tucson, AZ, USA, [on line], [retrieved from the internet on Feb. 7, 2011], URL <www.breault.com/resources/kbasePDF/wp_spie_026_microlenslet_array.pdf>, 8 pages. (date unknown but believed to be prior to the date of filing of the priority application).

(Continued)

*Primary Examiner* — Kiet T Nguyen
(74) *Attorney, Agent, or Firm* — Kristofor L. Storvick

(57) ABSTRACT

A method includes scanning a radiation beam with respect to a multi-photon curable photoreactive composition. The radiation beam includes a power sufficient to at least partially cure a volume of the multiphoton curable photoreactive composition. The method further includes modifying a characteristic of the radiation beam as the radiation beam is scanned.

18 Claims, 9 Drawing Sheets

U.S. PATENT DOCUMENTS

| | | | |
|---|---|---|---|
| 3,808,006 A | 4/1974 | Smith | |
| 4,249,011 A | 2/1981 | Wendling | |
| 4,250,053 A | 2/1981 | Smith | |
| 4,262,072 A | 4/1981 | Wendling | |
| 4,279,717 A | 7/1981 | Eckberg | |
| 4,394,403 A | 7/1983 | Smith | |
| 4,491,628 A | 1/1985 | Ito | |
| 4,642,126 A | 2/1987 | Zador | |
| 4,652,274 A | 3/1987 | Boettcher | |
| 4,668,601 A | 5/1987 | Kistner | |
| 4,859,572 A | 8/1989 | Farid | |
| 5,148,010 A | 9/1992 | Mori | |
| 5,235,015 A | 8/1993 | Ali | |
| 5,298,741 A | 3/1994 | Walt | |
| 5,369,511 A | 11/1994 | Amos | |
| 5,384,238 A | 1/1995 | Ellis | |
| 5,512,219 A | 4/1996 | Rowland | |
| 5,545,676 A | 8/1996 | Palazzotto | |
| 5,718,497 A | 2/1998 | Yokoyama | |
| 5,753,346 A | 5/1998 | Leir | |
| 5,770,737 A | 6/1998 | Reinhardt | |
| 5,856,373 A | 1/1999 | Kaisaki | |
| 5,858,624 A | 1/1999 | Chou | |
| 5,859,251 A | 1/1999 | Reinhardt | |
| 5,998,495 A | 12/1999 | Oxman | |
| 6,025,406 A | 2/2000 | Oxman | |
| 6,100,405 A | 8/2000 | Reinhardt | |
| 6,215,095 B1 | 4/2001 | Partanen | |
| 6,262,140 B1 | 7/2001 | Savant | |
| 6,288,842 B1 | 9/2001 | Florczak | |
| 6,316,153 B1 | 11/2001 | Goodman | |
| 6,560,248 B1 | 5/2003 | Vernackt | |
| 6,674,572 B1 | 1/2004 | Scheruebl | |
| 6,696,157 B1 | 2/2004 | David | |
| 6,713,772 B2 | 3/2004 | Goodman | |
| 6,750,266 B2 | 6/2004 | Bentsen | |
| 6,804,062 B2 | 10/2004 | Atwater | |
| 6,852,766 B1 | 2/2005 | DeVoe | |
| 6,855,478 B2 | 2/2005 | DeVoe | |
| 6,949,272 B2 | 9/2005 | Wochnowski | |
| 7,026,103 B2 | 4/2006 | DeVoe | |
| 7,070,406 B2 | 7/2006 | Jeans | |
| 7,157,145 B2 | 1/2007 | Vissing | |
| 7,374,417 B2 | 5/2008 | Kuwabara | |
| 7,551,359 B2 | 6/2009 | Murnan | |
| 7,563,013 B2 | 7/2009 | Lin | |
| 7,583,444 B1 | 9/2009 | DeVoe | |
| 7,887,889 B2 | 2/2011 | David | |
| 7,893,410 B2 | 2/2011 | Sykora | |
| 8,107,168 B2 * | 1/2012 | Murnan et al. | 359/629 |
| 8,109,665 B2 | 2/2012 | Lin | |
| 2002/0163619 A1 | 11/2002 | Matsuzawa | |
| 2002/0192569 A1 | 12/2002 | Ulland | |
| 2002/0197051 A1 | 12/2002 | Tamura | |
| 2003/0006535 A1 | 1/2003 | Hennessey | |
| 2003/0139484 A1 | 7/2003 | Bentsen | |
| 2003/0155667 A1 | 8/2003 | Devoe | |
| 2003/0175525 A1 | 9/2003 | Wochnowski | |
| 2004/0012872 A1 * | 1/2004 | Fleming et al. | 359/885 |
| 2004/0067431 A1 | 4/2004 | Arney | |
| 2004/0145915 A1 | 7/2004 | Kim | |
| 2004/0180210 A1 | 9/2004 | Vissing | |
| 2004/0202865 A1 | 10/2004 | Homola | |
| 2004/0223385 A1 | 11/2004 | Fleming | |
| 2004/0228112 A1 | 11/2004 | Takata | |
| 2005/0054744 A1 | 3/2005 | DeVoe | |
| 2005/0079295 A1 | 4/2005 | Schaepkens | |
| 2005/0133954 A1 | 6/2005 | Homola | |
| 2005/0147918 A1 | 7/2005 | Weber | |
| 2005/0254035 A1 | 11/2005 | Frankel | |
| 2005/0271794 A1 | 12/2005 | DeSimone | |
| 2005/0272599 A1 | 12/2005 | Kramer | |
| 2005/0273146 A1 | 12/2005 | DeSimone | |
| 2005/0287771 A1 | 12/2005 | Seamons | |
| 2006/0046156 A1 | 3/2006 | Amako | |
| 2006/0051048 A1 | 3/2006 | Gardiner | |
| 2006/0157444 A1 | 7/2006 | Nakamura | |
| 2006/0226566 A1 | 10/2006 | Kwak | |
| 2006/0231728 A1 | 10/2006 | Takamatsu | |
| 2006/0254894 A1 | 11/2006 | Jung | |
| 2006/0279025 A1 | 12/2006 | Heidari | |
| 2007/0018362 A1 | 1/2007 | Heidari | |
| 2007/0035843 A1 | 2/2007 | Cassarly | |
| 2007/0057031 A1 | 3/2007 | Lee | |
| 2007/0090278 A1 | 4/2007 | Botma | |
| 2007/0102844 A1 | 5/2007 | Simon | |
| 2007/0216049 A1 | 9/2007 | Rudmann | |
| 2007/0217181 A1 | 9/2007 | Chiu | |
| 2007/0264481 A1 | 11/2007 | DeSimone | |
| 2007/0271791 A1 | 11/2007 | Lai | |
| 2008/0007964 A1 | 1/2008 | Lin | |
| 2008/0083886 A1 | 4/2008 | Faklis | |
| 2008/0106001 A1 | 5/2008 | Slafter | |
| 2008/0196664 A1 | 8/2008 | David | |
| 2008/0319404 A1 | 12/2008 | Pekurovsky | |
| 2009/0061039 A1 | 3/2009 | Zhang | |
| 2009/0099537 A1 | 4/2009 | DeVoe | |
| 2009/0163127 A1 | 6/2009 | David | |
| 2009/0175050 A1 | 7/2009 | Marttila | |
| 2009/0213466 A1 | 8/2009 | Murnan | |
| 2009/0250635 A1 | 10/2009 | Sykora | |
| 2009/0279321 A1 | 11/2009 | Marttila | |
| 2009/0284840 A1 | 11/2009 | DeVoe | |
| 2009/0285543 A1 | 11/2009 | Marttila | |
| 2010/0227272 A1 | 9/2010 | DeVoe | |
| 2010/0239783 A1 | 9/2010 | Mao | |
| 2010/0288614 A1 | 11/2010 | Ender | |
| 2010/0296106 A1 | 11/2010 | Gates | |
| 2010/0308497 A1 | 12/2010 | David | |
| 2010/0308509 A1 | 12/2010 | David | |
| 2010/0316959 A1 | 12/2010 | Gates | |
| 2011/0001950 A1 | 1/2011 | DeVoe | |
| 2011/0090142 A1 | 4/2011 | You | |

FOREIGN PATENT DOCUMENTS

| | | |
|---|---|---|
| JP | 60-160017 | 8/1985 |
| JP | 02-103127 A | 4/1990 |
| JP | 10-031314 A | 2/1998 |
| JP | 11-024081 | 1/1999 |
| JP | 2001-150451 | 6/2001 |
| JP | 2006-106227 A | 4/2006 |
| KR | 10-2002-0088146 | 11/2002 |
| KR | 10-2007-0068852 | 7/2007 |
| WO | WO 98/21521 | 5/1998 |
| WO | WO 99/53242 | 10/1999 |
| WO | WO 01/96915 | 12/2001 |
| WO | WO 01/96952 | 12/2001 |
| WO | WO 01/96958 | 12/2001 |
| WO | WO 01/96961 | 12/2001 |
| WO | WO 02/05972 | 1/2002 |
| WO | WO 03/002269 | 1/2003 |
| WO | WO 2005/101466 | 10/2005 |
| WO | WO 2006/071914 | 7/2006 |
| WO | WO 2006/093963 A1 | 9/2006 |
| WO | WO 2007/051803 | 5/2007 |
| WO | WO 2007/073482 | 6/2007 |
| WO | WO 2007/137102 | 11/2007 |

OTHER PUBLICATIONS

Anderson, "Close-up Imaging of Documents and Displays with Lens Arrays", Appl. Opt., Feb. 15, 1979, vol. 18, No. 4, pp. 477-484.

Baldacchini and Fourkas, "Fabrication and Metallization of Three-dimensional Microstructures", Materials Research Society Symposium Proceedings, 2004, vol. EXS-2, pp. M10.1.1-M10.1.3.

Dentinger, "Removal of SU-8 Photoresist for Thick Film Applications", Microelectronic Engineering, 2002, vol. 61-62, pp. 993-1000.

Duparre, "Artificial Compound Eyes—Different Concepts and Their Application to Ultra Flat Image Acquisition Sensors", MOEMS and Miniaturized Systems IV; Proceedings of SPIE, 2004, vol. 5346, pp. 89-100.

Duparre, "Microoptical Telescope Compound Eye", Optics Express, Feb. 7, 2005, vol. 13, No. 3, pp. 889-903.

Hembd-Solner, "Imaging Properties of the Gabor Superlens", J. Opt. A: Pure Appl. Opt., 1999, vol. 1, pp. 94-102.

Hinsberg, "Effect of Resist Components on Image Spreading During Postexposure Bake of Chemically Amplified Resists", Advances in Resist Technology and Processing XVII; Proceedings of SPIE, 2000, vol. 3999, pp. 148-160.

Lafratta and Fourkas, "Direct Laser Patterning of Conductive Wires on Three-dimensional Polymeric Microstructures", Chem. Mater., 2006, vol. 18, pp. 2038-2042.

Li, "Multiphoton Polymerization", Materials Today, Jun. 2007, vol. 10, No. 6, pp. 30-37.

Maruo, "Three-dimensional Microfabrication with Two-photon-absorbed Photopolymerization," Opt. Lett., Jan. 15, 1997, vol. 22, No. 2, pp. 132-134.

Moon, Ford, and Yang, "Fabricating Three-dimensional Polymeric Photonic Structures by Multi-beam Interference Lithography", Polymers for Advanced Technologies, Feb. 2006, vol. 17, No. 2, pp. 83-93.

Piestrup, "Large Area X-ray and Neutron Imaging Using Three-dimensional Arrays of Microlenses", Rev. of Sci. Inst., Nov. 2004, vol. 75, No. 11, pp. 4769-4774.

Shaoulov, "Compact Microlenslet-array-based Magnifier", Opt. Lett., Apr. 1, 2004, vol. 29, No. 7, pp. 709-711.

Shaoulov, "Magnifying Miniature Displays with Microlenslet Arrays", Helmet- and Head-Mounted Displays IX: Technologies and Applications; Proceedings of SPIE, 2004, vol. 5442, pp. 246-253.

Tanaka, Ishikawa and Kawata, "Two-photon-induced Reduction of Metal Ions for Fabricating Three-dimensional Electrically Conductive Metallic Microstructure", Appl. Phys. Lett., 2006, vol. 88, pp. 81107-1-81107-3.

Xu, "Measurement of Two-photon Excitation Cross Sections of Molecular Fluorophores with Data from 690 to 1050 nm", J. Opt. Soc. Am. B, Mar. 1996, vol. 13, No. 3, pp. 481-491.

Zhou, "An Efficient Two-photon-generated Photoacid Applied to Positive-tone 3D Microfabrication", Science, May 10, 2002, vol. 296, No. 5570, pp. 1106-1109.

International Search Report for PCT/US2008/082588, 3 pgs.

Written Opinion of the ISA for International Application No. PCT/US2008/082588, 4 pgs.

International Search Report for PCT/US2009/034287, 3 pgs.

Written Opinion of the ISA for International Application No. PCT/US2009/034287, 3 pgs.

Allen, "193 nm Single Layer Positive Resists Building Etch Resistance into a High Resolution Imaging System", SPIE, 1995, vol. 2438, pp. 474-485.

Allen, "High Performance Acrylic Polymers for Chemically Amplified Photoresist Applications", J. Vac. Sci. Tech. B, Nov./Dec. 1991, vol. 9, No. 6, pp. 3357-3361.

Beck, "Improving Stamps for 10 nm Level Wafer Scale Nanoimprint Lithigraphy", Microelectr. Eng., 2002, vol. 61-62, pp. 441-448.

Beringer, "Diaryliodonium Salts, IX. The Synthesis of Substituted Diphenyliodonium Salts", J. Am. Chem. Soc., 1959, vol. 81, pp. 342-351.

Bongiovanni, "UV-curable Systems Containing Perfluoropolyether Structures: Synthesis and Characterization", Macromol. Chem. Phys., 1997, vol. 198, pp. 1893-1907.

Braun, "Polymer Replication of 3D Microstructures Employing a High Content Fluorine Separation Layer", Appl. Surf. Sci., 1999, vol. 138-139, pp. 206-211.

Chang, "A Roller Embossing Process for Rapid Fabrication of Microlens Arrays on Glass Substrates", Microsyst. Technol., Feb. 2006, vol. 12, pp. 754-759.

Eaton, "Dye Sensitized Photopolymerization", Advances in Photochemistry, 1986, vol. 13, pp. 427-487.

Groning, "'Self-thickness-limited' Plasma Polymerization of an Ultrathin Antiadhesive Film", J. Vac. Sci. Tech. A., Nov./Dec. 1996, vol. 14, No. 6, pp. 3043-3048.

Houle, "Antiadhesion Considerations for UV Nanoimprint Lithography", Applied Physics Letters, 2007, vol. 90, No. 213103, pp. 213103-1-213103-3.

Jaszewski, "Properties of Thin Anti-adhesive Films Used for the Replication of Microstructures in Polymers", Microelectr. Eng., 1997, vol. 35, pp. 381-384.

Jung, "Vapor-phase Self-Assembled Monolayer for Improved Mold Release in Nanoimprint Lithography", Langmuir, 2005, vol. 21, pp. 1158-1161.

Kim, "A Simple Fabrication Route to a Highly Transparent Superhydrophobic Surface with a Poly(dimethylsiloxane) Coated Flexible Mold", Chem. Commun., 2007, pp. 2237-2239.

Korner, "New Approaches in Depth-scanning Optical Metrology", Proc of SPIE, Apr. 1, 2004, vol. 5457, pp. 320-333, XP009084995.

Large, "The Use of Electrochemical Potential Data in Studies of Spectral Sensitization", Photographic Sensitivity, R.J. Cox, ed., Academic Press, Chapter 15, pp. 241-264, (1973).

Lee, "Antiadhesion Surface Treatments of Molds for High-Resolution Unconventional Lithography", Adv. Mater., 2006, vol. 18, pp. 3115-3119.

Lee, Handbook of Epoxy Results (1967).

Lee, "Self-Assembled Monolayer as an Antiadhesion Layer on a Nickel Nanostamper in the Nanoreplication Process for Optoelectronic Applications", Applied Physics Letters, 2006, vol. 88, No. 073101, pp. 073101-1-073101-3.

Lel, "Local Thickness and Wave Velocity Measurement of Wavy Films with a Chromatic Confocal Imaging Method and a Fluorescence Intensity Technique", Experiments in Fluids, Nov. 1, 2005, vol. 39, pp. 856-864.

Mann, Electrochemical Reactions in Nonaqueous Systems, (1970).

Park, "Fabrication of Nano-precision PDMS Replica Using Two-photon Photopolymerization and Vacuum Pressure Difference Technique", Bull. Korean Chem. Soc., 2004, vol. 25, No. 8, pp. 1119-1120.

Peng, "High Fidelity Fabrication of Microlens Arrays by Nanoimprint Using Conformal Mold Duplication and Low-pressure Liquid Material Curing", J. Vac. Sci. Technol. B, Mar./Apr. 2007, vol. 25, No. 2, pp. 410-414.

Shi, "Chromatic Confocal Microscopy Using Supercontinuum Light", Optics Express, May 17, 2004, vol. 12, No. 10, pp. 2096-2101.

Smith, Modern Optical Engineering: The Design of Optical Systems, 1966, pp. 104-105.

Wang, "Polybenzoxazine as a Mold-release Agent for Nanoimprint Lithography", Langmuir, 2007, vol. 23, pp. 5868-5871.

Weinberg, Techniques of Chemistry, vol. 5, Part II, Technique of Electroorganic Synthesis, (1975).

* cited by examiner

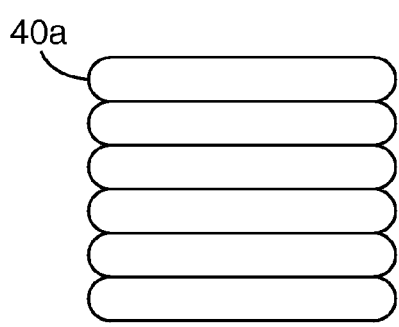
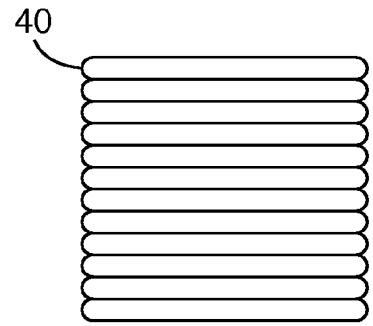
*Fig. 4A*  *Fig. 4B*
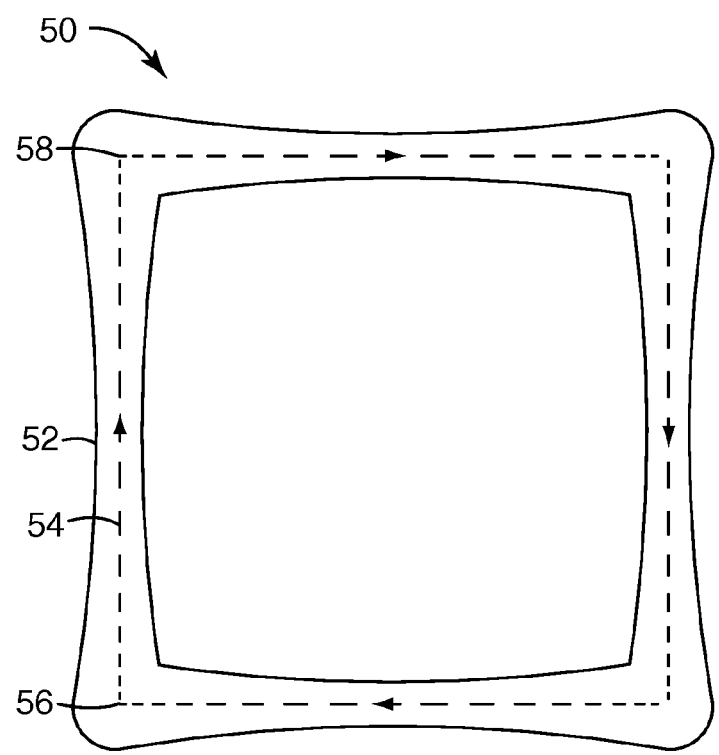
*Fig. 5*

METHOD FOR MAKING STRUCTURES WITH IMPROVED EDGE DEFINITION

CROSS REFERENCE TO RELATED APPLICATIONS

This application is a national stage filing under 35 U.S.C. 371 of PCT/US2008/082588, filed on Nov. 6, 2008, which claims priority to U.S. Provisional Application No. 61/013,121, filed on Dec. 12, 2007, the disclosure of which is incorporated by reference in its/their entirety herein.

TECHNICAL FIELD

The present disclosure relates to methods for producing structures using multiphoton absorbtion polymerization, and more particularly, to methods for improving edge definition of the structures.

BACKGROUND

Multiphoton curing processes are described in U.S. Pat. No. 6,855,478. In these processes, a layer of material including a multiphoton curable photoreactive composition is applied on a substrate (e.g., a silicon wafer) and selectively cured using a focused source of radiant energy, such as an ultrafast laser beam. A multiphoton curing technique may be useful for fabricating two-dimensional (2D) and/or three-dimensional (3D) structures with micro- or nano-scale resolution.

In one fabrication technique, a voxel, or 3D volume element, is created when a pulsed laser beam of visible or near-infrared (NIR) radiation is focused into an engineered photopolymer resin. A non-linear interaction process within the resin initiates cure of the resin near a focus of the laser beam, where two photons of the NIR radiation are absorbed substantially simultaneously. The curing of the resin may be referred to as "photopolymerization," and the process may be referred to as a "two-photon photopolymerization" process. Photopolymerization of the resin does not occur in regions of the resin exposed to portions of the NIR radiation having an insufficient intensity, that is, an intensity lower than a threshold dose for initiating photopolymerization.

A 3D structure may be constructed voxel-by-voxel with a multiphoton photopolymerization process by controlling a location of the focus of the laser beam in three dimensions (i.e., x-axis, y-axis, and z-axis directions) relative to the resin. In many cases, 3D structures are formed by curing approximately single voxel layers (e.g., in the x-y plane), followed by moving the focal point about one voxel length (e.g., in the z-axis), and curing a subsequent layer (e.g., in the x-y plane). This process may be repeated until the desired structure is at least partially cured.

Typically, the focal point of the laser beam is approximately spherical or ellipsoidal, with an intensity profile that is roughly Gaussian along any diameter. Accordingly, the voxels cured by exposure to the laser beam are roughly spherical, or may be similar to an elongated sphere, where the elongation is along one or more than one axis (e.g., x-axis, y-axis, or z-axis).

SUMMARY

The current disclosure is generally directed to systems and methods for improving an edge definition of structures formed by multiphoton exposure. Broadly, edge definition may be defined as any characteristic of an edge or surface of a structure, such as a roughness of the surface, fidelity of the cured surface or edge to the desired surface or edge, or the like. Improving edge definition may be desirable in order to create structures that have a higher fidelity to the desired shape. Methods of improving edge definition may broadly include real-time power control, trajectory control with high speed shuttering, dithering, and spatial modulation of the exposure beam.

In one aspect, the disclosure is directed to a method including scanning a radiation beam with respect to a multiphoton curable photoreactive composition. The radiation beam includes a power sufficient to at least partially cure a volume of the multiphoton curable photoreactive composition. The method further includes modifying a characteristic of the radiation beam as the radiation beam is scanned.

In another aspect, the disclosure is directed to a method including scanning a focal point of a radiation beam within a multiphoton curable photoreactive composition to at least partially cure a volume of the multiphoton curable photoreactive composition via multiphoton absorption, measuring a power of at least a portion of the radiation beam using a power meter while the focal point is scanned, comparing the measured power of the at least a portion of the radiation beam with a desired power of the radiation beam, and adjusting the power of the radiation beam while the focal point is scanned when based on a difference between the measured power and desired power is detected.

In another aspect, the disclosure is directed to a method including specifying a region including a border in a multiphoton curable photoreactive composition. The method further includes scanning a radiation beam with respect to the multiphoton curable photoreactive composition within the specified region. The radiation beam includes a power sufficient to at least partially cure a volume of the multiphoton curable photoreactive composition. The method further includes scanning the radiation beam past the border and out of the specified region, and shuttering the radiation beam once the radiation beam is outside the specified region. The radiation beam is then scanned past the border and into the specified region, and the radiation beam is unshuttered once the radiation beam is within the specified region. The scan velocity of the radiation beam is not changed as the beam is scanned past the border.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 4A and 4B are cross-sections of cubes formed by conventional multiphoton curing systems.

FIG. 5 is a top view of an outline of a square formed by conventional multiphoton curing systems.

DETAILED DESCRIPTION

Figure 1:
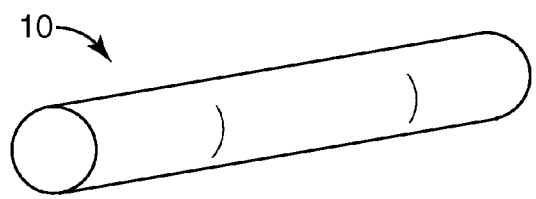
FIG. 1 is an illustration of a structure formed by a single scan of a radiation beam.
Figure 2:
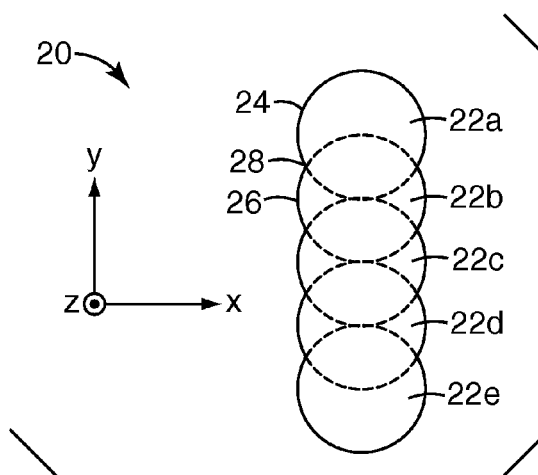
FIG. 2 is an illustration of a single voxel wide structure formed by conventional multiphoton curing systems.

When curing a surface or a structure using, for example, a multiphoton polymerization system, a spherical voxel shape may be disadvantageous. For example, as shown in FIG. 1, when a laser beam from a multiphoton polymerization system is scanned in a substantially straight line, a substantially cylindrical shape 10 is formed. In FIG. 2, the laser beam was scanned perpendicular to the plane of the paper (parallel to the z-axis) to form a one voxel thick structure 20 in the z-y plane. The structure 20 includes five partially overlapping scan lines 22a, 22b, 22c, 22d, 22e (collectively "scan lines 22"), each resulting from a single scan of the laser beam parallel to the z-axis. As is clearly seen, even when there is substantial overlap of adjacent scan lines (e.g., scan lines 22a and 22b), an uneven surface 24 remains that includes poorly defined edges. The surface 24 includes numerous ridges 26 corresponding to the widest part of the scan line 22 (in the x-axis), and numerous depressions 28 corresponding to areas where the scan line 22 is not as wide and does not overlap sufficiently with the adjacent scan line (e.g., 22a and 22b) to form a smooth surface.

Figure 3:
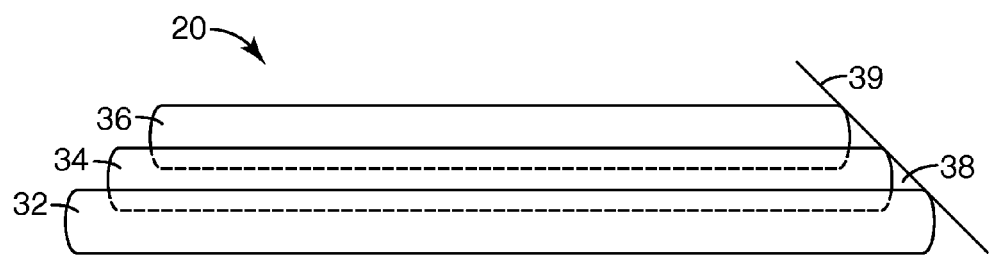
FIG. 3 is an illustration of a structure with diagonal surfaces formed by conventional multiphoton curing systems.

As illustrated in FIG. 3, the finite diameter of the voxel may limit the smoothness of a desired surface formed by the ends of multiple layers 32, 34, 36, even when the individual layers 32, 34, 36 are at least partially overlapped. Forming a surface in this manner may result in a surface 39 with step-like depressions 38.

A smaller voxel size may be used to reduce surface roughness and improving edge definition, but this approach may increase the time necessary to cure a structure. As an illustration, consider a cube 40a, shown in FIG. 4A. A cube 40a may be formed by curing successive layers to build up the desired height of the cube 40a. In the example shown in FIG. 4A, the cube 40a requires six stacked layers. If, then, the voxel size is decreased by half (while maintaining the scanning velocity), as shown in FIG. 4B, the time to cure cube 40b will double, because twice as many layers (e.g., twelve) will be necessary to form the desired height of the cube 40b.

Edge definition is further limited in conventional multiphoton exposure systems by the limited amount of real-time information about and control over the beam characteristics, such as, for example, power, focal point size, and the like. For example, the power of the laser beam may be determined and set to a substantially constant value prior to commencing exposure of a structure. Typically, the power is then not intentionally modified for at least a portion of the exposure of the structure.

As a simplification, the amount of energy in the form of NIR radiation that is absorbed by a volume of resin may generally be proportional to the power of the radiation beam multiplied by the amount of time the volume of resin is exposed to the beam. This may result in problems when a scanning direction change is necessary. For example, the relative position between the beam and the resin is typically controlled via a controllable stage or a controllable optical array, including, for example, moveable mirrors, lenses, and the like. All of these objects have mass, and thus experience a finite acceleration and deceleration in response to an applied force. Therefore, changing the scan direction of the beam typically requires at least some change in the scanning velocity of the beam, and thus, exposure time of a volume of resin to the beam. This, then, changes the energy absorbed by a volume of resin and the resulting size of the at least partially cured voxel.

One relatively simple example of this phenomenon is illustrated in FIG. 5. In FIG. 5, an outline 54 of a square 50 is desired. The beam power has been set prior to beginning the scan, and the scan is begun, for example, at the lower left corner 56. The beam is the scanned in a vertical direction to trace the left side of the square 50. As the beam is scanned in the vertical direction, the beam is accelerated from rest to the beam's desired substantially constant velocity. If the structure is sufficiently small, the beam may not reach its desired substantially constant velocity prior to beginning to decelerate to prepare to change directions. Regardless whether the beam reaches its substantially constant scanning velocity, as the beam accelerates the at least partially cured voxel size decreases, because the beam power is maintained at a substantially constant value. This causes the width of the at least partially cured outline 52 to decrease as the beam accelerates, and then increase again when the beam decelerates in preparation for turning the corner at 58.

As is clear from the preceding discussion, lack of real-time control over certain beam characteristics may cause the at least partially cured structure to lack fidelity to the desired structure.

Figure 6:
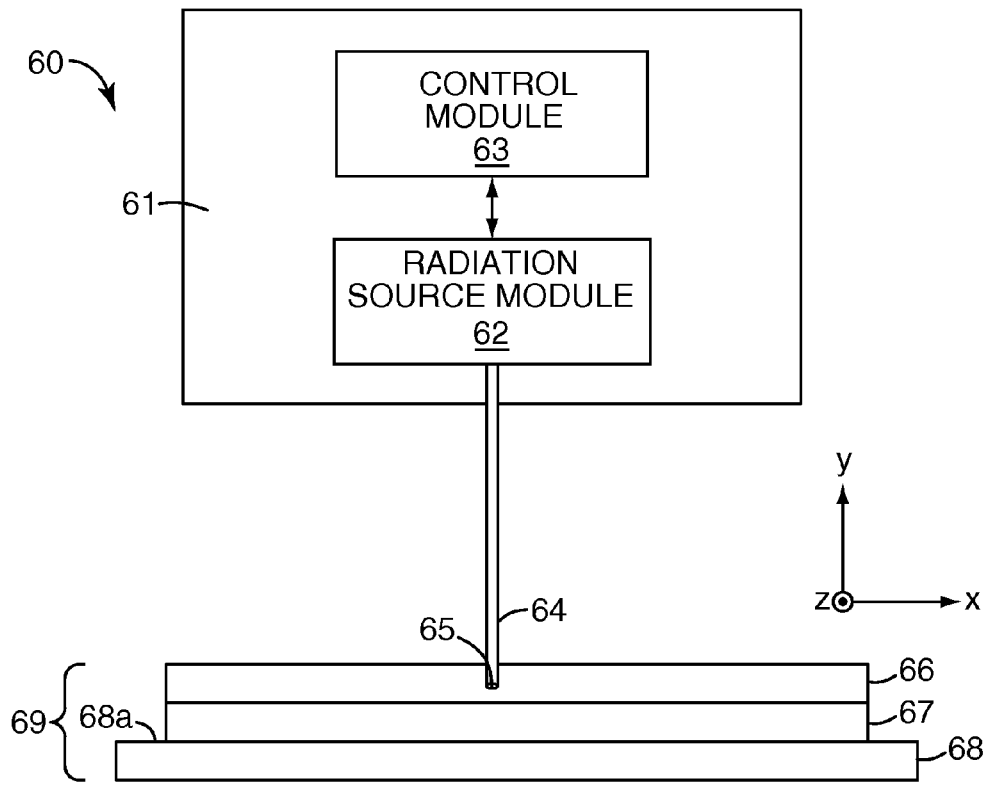
FIG. 6 is a schematic block diagram of an optical system including a radiation source module.

FIG. 6 is a block diagram illustrating a fabrication system 60 that may be used to fabricate one or more structures using multiphoton exposure, such as microstructures or nanostructures. Fabrication system 60 includes an optical system 61, which includes a radiation source module 62. Fabrication system 60 further includes a control module 63, a multiphoton curable photoreactive composition 66 (hereafter "resin 66"), a substrate 67 on which resin 66 is placed, and a stage 68 to support resin 66 and substrate 67.

Optical system 61 is an optical imaging system of fabrication system 60. Radiation source module 62 of optical system 61 provides a radiation beam 64, such as, for example, an ultrafast visible or near-infrared (NIR) laser beam, that is focused through an objective lens within radiation source module 62 onto image plane 69. Resin 66, substrate 67, and stage 68 are positioned at image plane 69 in the configuration of fabrication system 60 shown in FIG. 6.

In general, control module 63 controls optical system 61 to direct one or more radiation beams at resin 66 in order to selectively cure one or more regions of resin 66 and fabricate one or more at least partially cured voxels of substantially equal or different sizes within resin 66.

Optical system 61 may employ different modules to achieve control over the quality and positioning of a focal point of one or more radiation beams (e.g., laser beams). Customizing the characteristics of beam 64 (e.g., size, shape, power, etc.) as well as controlling the position of the focal point 65 of beam 64 may be useful in the multiphoton photopolymerization fabrication process in order to, for example, accurately and precisely create the desired structural features within resin 66.

In some embodiments, when radiation of sufficient intensity is present within resin 66, a nonlinear process occurs where two or more photons of radiation (e.g., NIR radiation) interact with a volume of resin 66. During the nonlinear process, the volume of resin 66 at focal point 65 of radiation beam 64 absorbs two or more photons of light, which induces a chemical reaction that leads to the curing of resin 66 proximate to focal point 65 to create an at least partially cured voxel. For example, in one embodiment, a suitable multiphoton curable photoreactive composition in layer of resin 66 includes at least one reactive species that is capable of undergoing an acid or radical initiated chemical reaction, as well as a multiphoton initiator system. Exposure of regions of layer of resin 66 with a beam 64 of an appropriate wavelength and sufficient intensity of light (equal to or above a "threshold intensity"), which may be, for example, a near infrared (NIR) intensity, causes two-photon absorption in the two-photon initiator system, which induces in the reactive species an acid or radical initiated chemical reaction in a region of resin 66 that is exposed to beam 64.

The chemical reaction in a volume of resin 66 that is exposed to beam 64 may cause a detectable change in the chemical or physical properties in at least a portion of the volumes of layer of resin 66 that are exposed to beam 64. Examples of detectable changes include, for example, crosslinking, polymerization, and/or a change in solubility characteristics (for example, lesser or greater solubility in a particular solvent) as compared to the photoreactive composition prior to exposure. The occurrence of any of these detectable changes is referred to herein as curing, and the curing continues until an at least partially cured object is formed. The curing step may take place in any volume within layer of resin 66 that is exposed to focal point 65 of beam 64. Following the curing step, layer of resin 66 may optionally be developed by removing a non-cured portion of the layer to obtain the cured object, or by removing the cured object itself from the layer.

In the embodiment shown in FIG. 6, resin 66 may include any suitable photosensitive resin (e.g., a multiphoton curable photoreactive composition). Multiphoton exposable photoreactive compositions may include a reactive species, a multiphoton photo sensitizer, an electron acceptor, and other optional components. Examples of suitable multiphoton curable photoreactive compositions are described in U.S. patent application Ser. No. 60/752,529, entitled, "METHOD AND APPARATUS FOR PROCESSING MULTIPHOTON CURABLE PHOTREACTIVE COMPOSITIONS," and U.S. patent application Ser. No. 60/979,229, entitled, "Highly Functional Multiphoton Curable Reactive Species,".

Beam 64 and layer of resin 66 may be moved in at least one of the x-axis, y-axis or z-axis directions relative to each other, where orthogonal x-z axes are in the plane of the image shown in FIG. 6 and the y-axis extends in a direction substantially perpendicular to the plane of the image, in order to fabricate multiple at least partially cured voxels within resin 66. Beam 64 may be moved along the x, y, and/or z axis directions relative to resin 66, stage 68 may be moved along the x, y, and/or z axis directions relative to beam 64, or both beam 64 and stage 68 may be moved relative to each other in order to fabricate voxels at different positions within resin 66. The multiple at least partially cured voxels may define features of a structure.

Optical system 61 may include beam positioning modules to help selectively position radiation beam 64 within resin 66 in order to control the position of focal point 65 within resin 66 and thereby selectively cure volumes of resin 66 to define the features of structures. The beam positioning modules may include, for example, one or more mirror mounted on a galvanometer. Moving the mirror may cause a corresponding movement of the focal point 65 of beam 64 within resin 66. Knowing the position and movement of the mirror, then, may allow knowledge of the position and movement of focal point 65 of beam 64.

Control module 63 may control the position and movement of the mirror via controlling the galvanometer. Control module 63 may also include sensors coupled to the galvanometer or mirror to determine the position and movement of the mirror, and may include software that determines the position and movement of the focal point 65 of beam 64 based on the position of the mirror and substrate 67.

Substrate 67 supports resin 66. Substrate 67 may be formed of any suitable material or combination of materials sufficient to support resin 66. In some embodiments, substrate 67 defines a substantially planar surface for supporting resin 66. In some preferred embodiments, substrate 67 may comprise a silicon wafer, a glass plate, a machined substrate, or combinations thereof.

Stage 68 defines a surface that supports substrate 67. Thus, in many cases, the configuration of stage 68 is selected to complement the configuration of substrate 67. For example, in the embodiment shown in FIG. 6, stage 68 defines a substantially planar surface 68A for supporting substantially planar substrate 67.

In some embodiments, stage 68 is movable along at least one of the x-axis, y-axis, and z-axis directions, e.g., under the control of control module 63. Control module 63 may change a position of stage 68 in order to change the location of focal point 65 of beam 64 relative to resin 66. In some embodiments, however, at least one of the x-axis, y-axis, and z-axis positions of focal point 65 of beam 64 relative to resin 66 is modified with the aid of components of optical system 61.

Radiation source module 62 includes a light source that provides a beam 64 of sufficient power to cure resin 66. In embodiments in which optical system 61 is used in a multiphoton polymerization process, radiation source module 62 provides a beam 64 that has a sufficient power to effect multiphoton absorption at a wavelength appropriate for the multiphoton absorber used in the photoreactive composition of resin 66. Radiation source 62 provides the necessary peak power and intensity to initiate cure of resin 56. In some embodiments, radiation source 62 may provide a beam including an output pulse width of between about 1 femtosecond (fs) and about 10 ps, such as about 100 fs. In some cases, a higher pulse rate may be desirable.

In one embodiment, radiation source module 62 provides a relatively low power, ultrashort laser light, such as a pulsed femtosecond laser. As one example, radiation source module 62 may include a Spectra-Physics MaiTai laser, commercially available from Newport Corporation of Irvine, Calif.

Rather than emitting a single burst of light, radiation source module 62 may emit the relatively low pulse energy laser light in sequential pulses to cause substantially simultaneous multiphoton absorption by resin 66. In some embodiments, the pulses of light from module 62 may be directed at substantially the same part of resin 66 to cause absorption of the multiple pulses to cure a single voxel. In other embodiments, the multiple pulses may cure a plurality of voxels. A "low pulse energy" laser light refers to a light exhibiting an insufficient power to fully cure a volume of resin 66 with a single burst. Rather, with a low pulse energy laser, the sequential bursts are necessary to fully cure a volume of resin 66.

Figure 7:
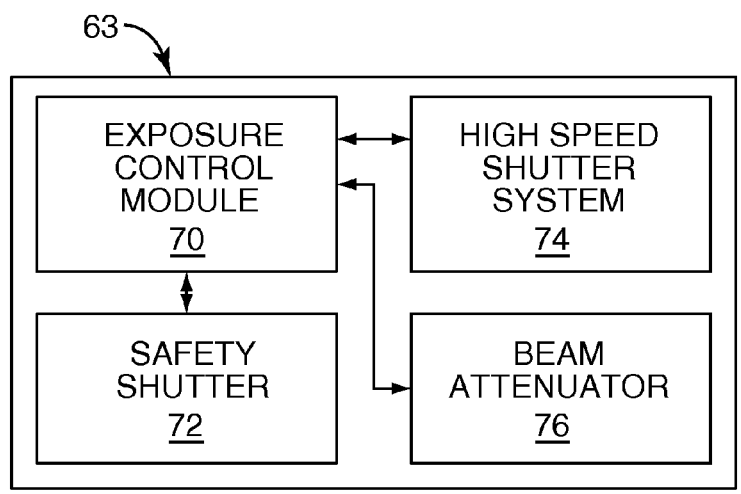
FIG. 7 is a schematic block diagram of a control module.

FIG. 7 is a block diagram of control module 63, which includes control module 60, safety shutter 72, high speed shutter system 74, and beam attenuator 76. Control module 63 initiates and terminates the exposure of resin 66 to radiation beam 64 in order to selectively cure portions of resin 66 and create 3D features. In addition, control module 63 controls the power of radiation beam 64. As previously described, the process of curing resin 66 to form a voxel is substantially nonlinear, and any deviation from the desired laser power during the exposure process may create errors. Based on feedback from an optical diagnostic module, control module 63 controls the power of radiation beam 64 to a desired level or within a certain range of the desired level. A power meter may measure the power of radiation beam 64 at one or more points along the optical path in system 60. Based on this measured power, control module 63 may adjust the power of beam 64 substantially in real-time, i.e., while the beam 64 is scanned relative to resin 66.

Accordingly, control module 63 may incorporate beam attenuator 76 to adjust the power of beam 64 to the desired level. In some embodiments, beam attenuator 76 includes a half-wave plate (HWP) and polarizing beam splitter (PBS) or a HWP and a polarizer to attenuate the light from radiation source module 62. In some embodiments, beam attenuator attenuates the light from radiation source module 62 when module 62 outputs a light that has a power greater than that desired to cure resin 66. Reducing the power of beam 64 helps to reduce the size of an at least partially cured voxel created by the exposure of a volume of resin 66 to focal point 65 of beam 64.

In some embodiments, incoming light directed at the PBS may be split into at least two portions by the PBS, where a first portion is directed by the PBS into a power meter, which may estimate the power of beam 64 based on the power of the first portion of beam 64, while another portion of beam 64 is directed by the PBS through the remaining portion of the optical system 61 towards the focal plane 69. The power meter may comprise, for example, a multimeter, which includes a silicon chip that outputs a voltage indicative of power. The power meter measures the power of the first portion of beam 64 and estimates the total power of the entire beam 64. Based on the power measurement, the power meter may provide feedback to control module 63, which may then adjust the power of beam 64 as necessary. For example, the power of beam 64 may be adjusted at radiation source module 62 or at another point within optical system 61.

In other embodiments, beam attenuator 76 may include a beam sampler. The beam sampler may reflect a percentage of the beam 64 incident on the sampler, for example a small percentage of beam 64. This percentage of beam 64 may be sampled by the power meter to determine the power of the entire beam 64.

Although only a portion of beam 26 is inputted into the power meter, the power meter or control module 63 may use an appropriate algorithm to estimate the power of the entire beam 64 based on a power measurement of the portion.

Figure 8:
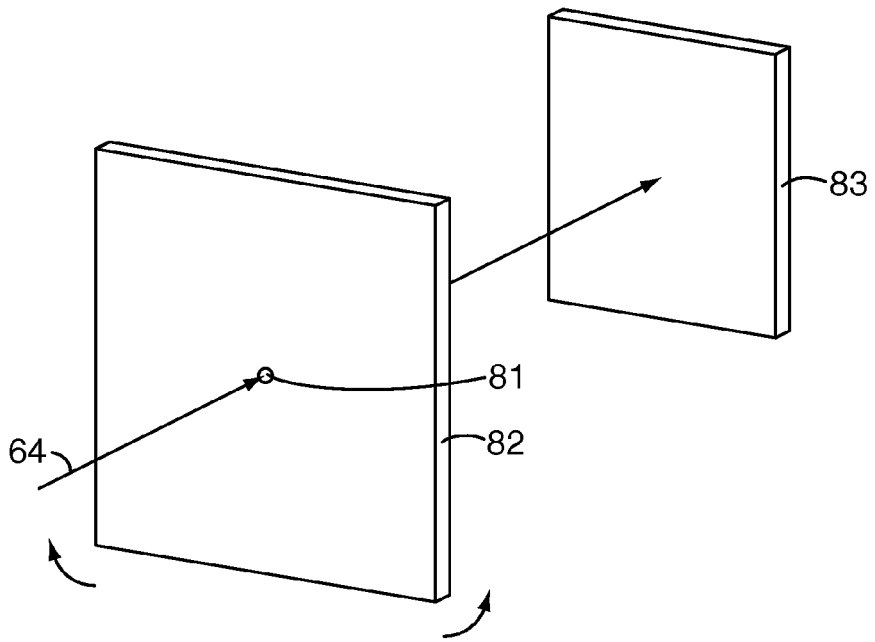
FIG. 8 is a perspective diagram of an exemplary half wave plate and polarizer.

In one embodiment, as shown in FIG. 8, the HWP 82 is mounted for rotational movement, and a high-speed galvanometer motor rotates the HWP 82 under the control of control module 63. In one embodiment, the HWP 82 may be rotated about 45° in either direction about a central axis 81. As the HWP 82 is rotated a polarization component of the beam 64 is rotated. The beam 64 exits the HWP 82 and encounters a polarizer 83. Depending on the polarization properties of beam 64, different amounts of beam 64 may be transmitted through polarizer 83, thus changing the power of the beam 64.

Figure 9:
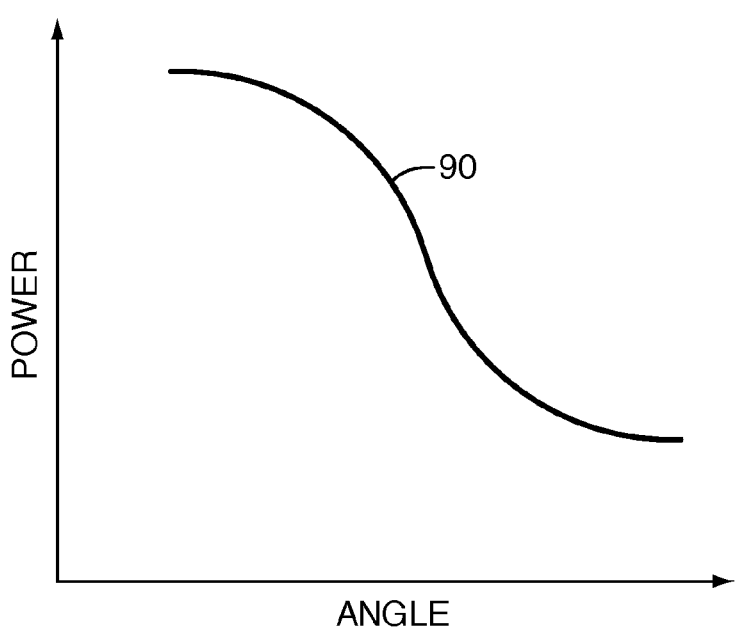
FIG. 9 is an exemplary graph of power versus have wave plate angle.

The dependence of the power of beam 64 on the angle of HWP 82 may be experimentally determined and a corresponding curve 90 of power versus angle may be created, as shown in FIG. 9. While one type of potential curve is shown in FIG. 9, other curves may be possible, such as, for example, linear curves, exponential curves, and the like. The experimentally-derived curve may be programmed into software and used to control the power of beam 64 by the rotation of HWP 82.

In general, the HWP helps achieve a relatively high-speed power control such that the power of beam 64 for the voxel creation process may be changed substantially in real-time while creating one or more voxel within resin 66.

In another embodiment, a Pockels cell may also be used to provide real-time power control. For example, applying a prescribed voltage to a Pockels cell may result in a prescribed alteration of a polarization property of beam 64 passing through the Pockels cell. In this way, a Pockels cell may replace the HWP 82 and, in combination with a polarizer, provide real-time power control of beam 64.

In other embodiments, control module 63 may include other power and energy monitoring devices in addition to or instead of beam attenuator 76. Furthermore, other power and energy monitoring devices may be incorporated into optical system 61 at specific steps or intervals and at various locations in order to set the desired power level or track the power levels or time with regards to specific optical components.

Real-time control of the power of beam 64 may mitigate the effects of any changes in scanning velocity. For example, the power of beam 64 may be decreased as the scan rate of the beam 64 is decreased to maintain a substantially constant voxel size.

Figure 10:
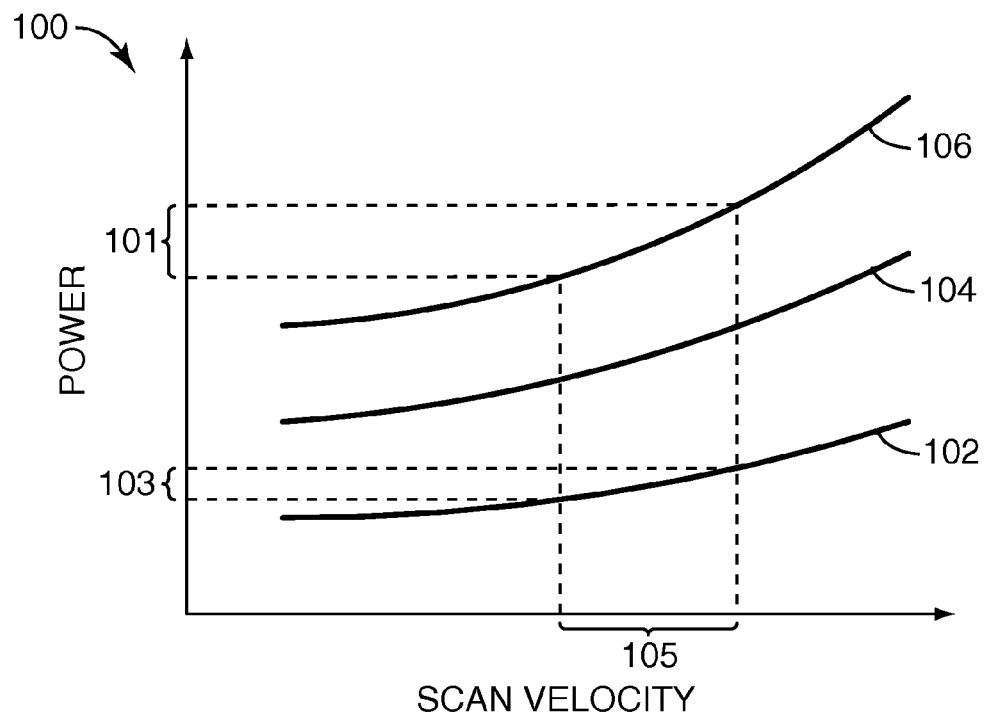
FIG. 10 is a plot of power versus scan velocity.

For a given resin 66, voxel size may generally be thought of as a function of the amount of energy absorbed by a volume of resin 66. As a simplification, the total amount of energy absorbed by a volume of resin 66 may be approximately proportional to the amount of time a volume of resin 66 is exposed to focal point 65 of beam 64 times the power of beam 64. The relationship between the power of beam 64, scanning velocity of beam 64, and the voxel size may be quite complex. An exemplary graph 100 of the non-linear relationship between voxel size, power and scan velocity is shown in FIG. 10. The specific relationship between scan velocity, power, and voxel size may not correspond to the embodiment shown in FIG. 10, and the features of FIG. 10 are intended to illustrate a basic concept, not the actual behavior of a specific beam 64 and resin 66 system. More specifically, the non-linear interaction of a beam 64 with resin 66 may depend on a wide range of factors including, for example, composition of the resin 66, such as photoinitiator system and curable species, the beam 64 wavelength, the pulse width, the scan velocity, the power of the beam 64, and the like.

In FIG. 10, the graph 100 includes three constant voxel size curves 102, 104, 106, which correspond to a small voxel size curve 102, an intermediate voxel size curve 104, and a large voxel size curve 106, respectively. As shown in FIG. 10, the curvature of the constant voxel size curves 102, 104, 106 need not be the same. That is, for a large voxel it may require a larger decrease in power 101 to maintain the voxel size for a given decrease in velocity 105 than the power decrease 103 required to maintain the size of a smaller voxel for the same decrease in scan velocity 105. Alternatively, a lower power decrease may be necessary to maintain a substantially constant voxel size for a large voxel than for a smaller voxel, or the power decrease required to maintain a substantially constant voxel size may be approximately equal for a large voxel and a smaller voxel.

In either case, the specific shape of the constant voxel size curves 102, 104, 106 is typically determined empirically by producing many structures, such as, for example, lines, at different power and scan velocity combinations. The resulting voxel size (e.g., the width of the line) is measured, and curves similar to those shown in FIG. 10 are generated. These curves may be programmed into a software program stored in and executed by control module 63. The software program utilize the beam 64 position and movement (scan velocity) data collected by control module 63 and the power of the beam 64 measured and calculated by the power meter to determine when and how the power of beam 64 should be adjusted based on the desired voxel size and scan velocity of beam 64. While the constant voxel size curves 102, 104, 106 are shown as being substantially non-linear throughout the range depicted in FIG. 10, in some embodiments, the curves 102, 104, 106 may include substantially linear sections.

Figure 11:
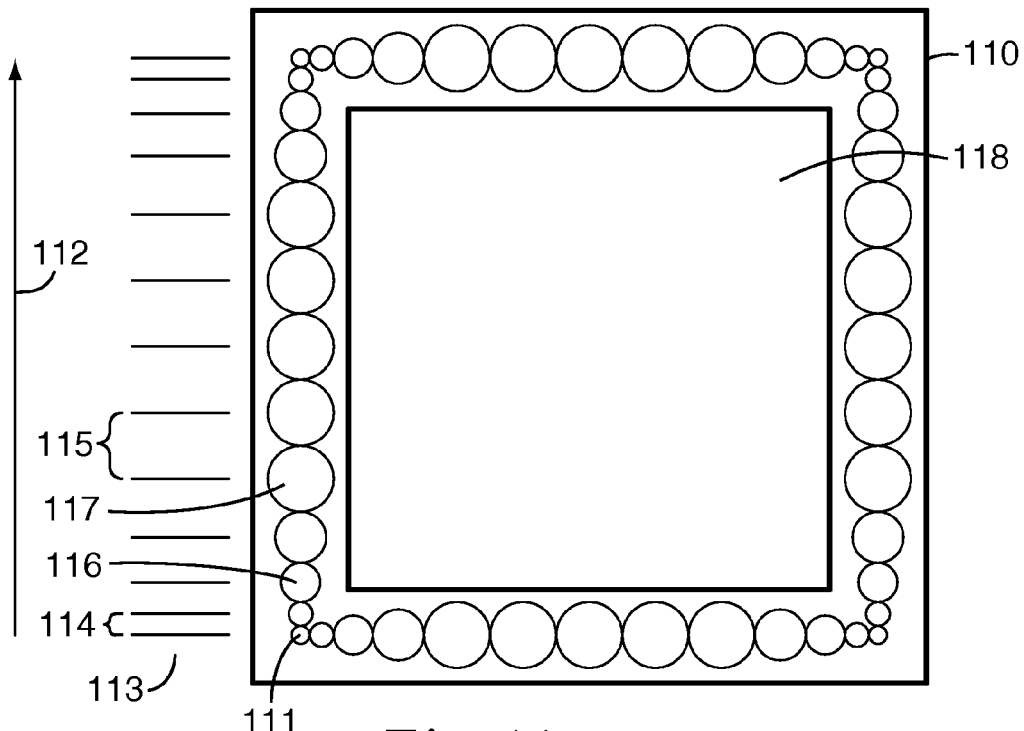
FIG. 11 is a diagram illustrating an exemplary method of forming a perimeter of structure using multiphoton curing.

FIG. 11 shows an exemplary structure formed using this strategy. Similar to FIG. 5, an outline of a square 110 is desired. In this example, the beam 64 begins scanning at the lower left corner 111 and scans substantially vertically, as indicated by arrow 112. In this example, beam 64 begins at rest at point 111. Because the mirror(s) attached to galvanometers used to scan beam 64 have mass, when a force is applied, the mirror(s) accelerate at a finite rate. This acceleration is represented in line plot 113, where each line represents the position of the beam at a subsequent unit of time. Thus, the greater the distance between adjacent lines in plot 113, the faster the beam travels. Initially, beam 64 is scanning relatively slowly, as indicated by the relatively small distance between adjacent lines, shown by bracket 114. However, in a relatively short distance, beam 64 has accelerated to its desired scanning velocity, as indicated by bracket 115.

In order to keep the total energy absorbed by a volume of resin 66 substantially constant, the power of beam 64 is increased as the beam 64 accelerates, as illustrated by the circles of changing diameter 116, 117. When the beam 64 is scanning relatively slowly (bracket 114), the power is relatively low, as illustrated by the small circle surrounding point 111. Once the beam 64 reaches its substantially constant desired scanning rate (bracket 115), the power of the beam is maintained at a substantially constant power, as illustrated by circle 117, which is higher than the initial power of beam 64. The specific correlation between voxel size, the power of beam 64, and scanning rate may be determined empirically for each resin 66 and system including beam 64, as described in further detail above.

Controlling the power of beam 64 in response to changes in the scanning rate may result in a substantially constant at least partially cured voxel size, as demonstrated by the substantially constant-width outline of square 110. Real-time control of the power of beam 64 may also be useful to maintain the power of beam 64 within a specified amount of the desired power. For example, the radiation source module 62 may produce a beam 64 that includes undesired fluctuations in the power of beam 64. Real-time power control may help to mitigate these fluctuations and maintain the power of beam 64 within a certain range, such as within +/−1%, or another desired value.

Real-time control of the power of beam 64 may also be desirable to control the at least partially cured voxel size for forming coarser or finer features. For instance, a larger voxel size may decrease the amount of time required to cure a larger area, while a smaller voxel size may be desired to facilitate exposure of finer features. As one example, a smaller voxel size (e.g., lower power and/or higher scan velocity) may be used in conjunction with real-time power control to expose the outline of square 110, followed by the use of a larger voxel (e.g., higher power and/or lower scan velocity) to cure the interior 118 of square 110 more efficiently.

Exposure control module 70 may include a processor, such as a microprocessor, DSP, an ASIC, a FPGA, discrete logic circuitry, or the like. The processor may implement software, hardware, firmware or a combination thereof to control each of modules 72, 74, and 76.

In some embodiments, control module 63 includes safety shutter 72 to block beam 64. Safety shutter 72 may be useful for, for example, blocking beam 64 while radiation source module 62 is warming up the radiation beam source. In some types of laser beams, the laser warms-up prior to reaching a steady level of power. For example, the Spectra-Physics MaiTai laser may take between about five minutes to about 30 minutes to stabilize to a desired level. However, in some cases, beam 64 may require multiple hours to stabilize, depending upon the desired level of stability. During the warm-up period, beam 64 may undergo fluctuations in power and stability of beam pointing (e.g., the predictability of focal point 65). Control module 70 may control safety shutter 72 to block beam 64 during the warm-up period, as well as other times during which it is undesirable for beam 64 to contact resin 66. For example, safety shutter 72 may be used as an emergency shut-off of optical system 61, in addition to or instead of turning off radiation source module 62.

Control module 63 also includes high speed shutter system 74 that initiates and terminates exposure of beam 64 after beam 64 is substantially stabilized and resin 66 is in a desired position relative to focal point 65 of beam 64. Exposure control module 70 within control module 63 may control the shutter system 74. A "high" speed shutter system 74 may generally be any shutter system that may turn the resin 66 exposure to beam 64 on or off at a speed greater than about one switch between an on/off stage per 50 nanoseconds (50 ns), such as a speed of about one on/off cycle in about 20 ns.

In one embodiment, the high speed shutter system 74 includes a Pockels cell and a polarizer. The Pockels cell comprises voltage applied to crystal(s) that may alter the polarization properties of a passing beam. In one type of high speed shutter system, the Pockels cell is combined with a polarizer. The Pockels cell may be switched between a no optical rotation position (0 degrees (°)) and a generally 90° rotation in order to define a shutter than opens or closes in nanoseconds. In addition, the Pockels cell and polarizer combination may be rotated to a position between 0° and 90° in order to change the intensity of beam 64 prior to beam 64 contacting resin 66.

In another embodiment, high speed shutter system 74 of control module 63 includes an acousto-optic modulator (AOM), which uses the acousto-optic effect to diffract and shift the frequency of light using sound waves, such as radio-frequency sound waves. In one type of AOM, a piezoelectric transducer is attached to a material such as glass, and an oscillating electric signal vibrates the transducer, which creates sound waves in the glass. The sound waves change the index of refraction, which disperses the incoming beam 64 from radiation source module 62. In some cases, however, such as when radiation source module 62 incorporates a femtosecond laser, the optical dispersion of beam 64 within the AOM may affect the optical precision of beam 64.

In yet other embodiments, high speed shutter system 74 may include mechanical switching devices, such as one or more mechanical shutters, a variable filter or etalon. The Pockels cell, AOM, mechanical switching devices, and other high speed shutter systems may be used alone or in combination with each other.

As described briefly above, the high speed shutter system 74 may be used to quickly turn on and off exposure of resin 66 to beam 64 when desired. This may enable more efficient writing algorithms, such as, for example, the writing algorithms represented in FIGS. 12, 13, and 14.

Figure 12:
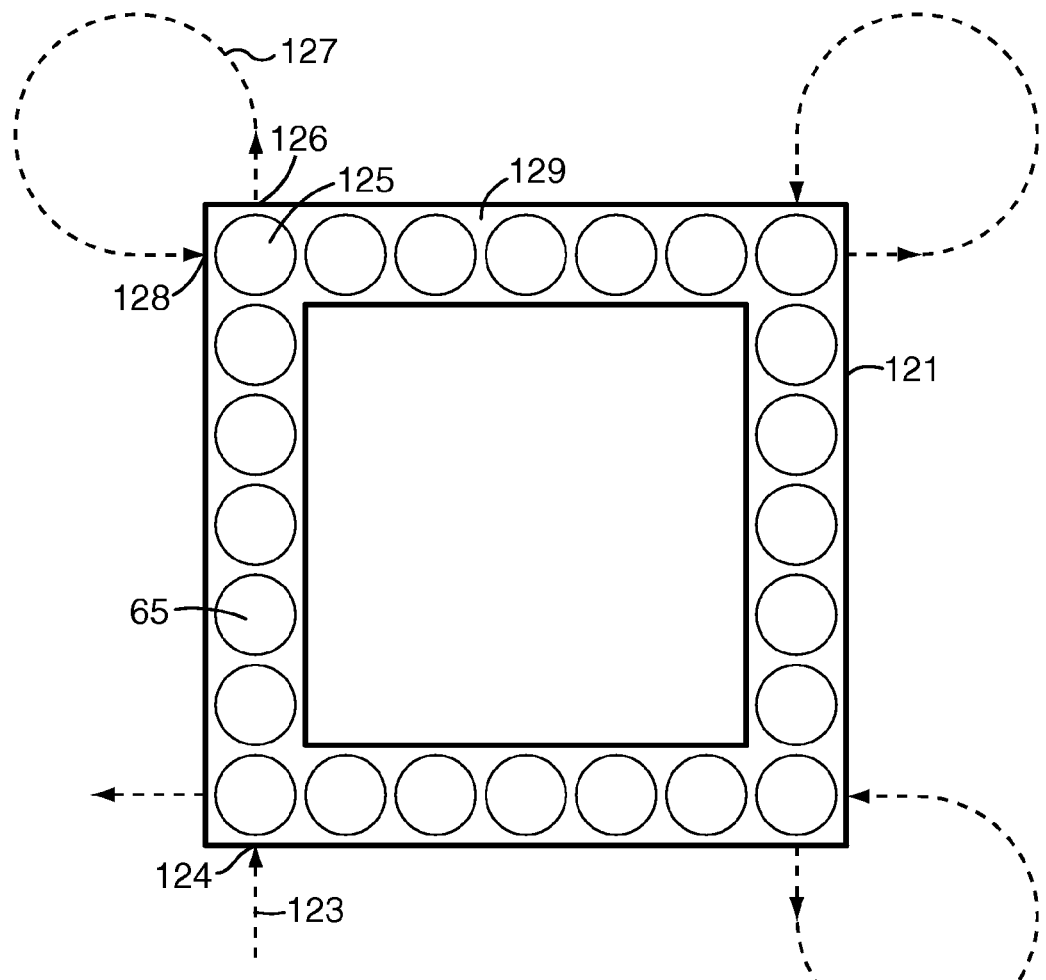
FIG. 12 is a diagram illustrating another exemplary method of forming a perimeter of a structure using multiphoton curing.

FIG. 12 illustrates an outline of a square 121, similar to the desired shape of square 50 of FIG. 5. The outline of the square 121 may be formed by scanning focal point 65 of beam 64 in the shape of square 121. Initially, the focal point 65 of beam 64 is scanned in the vertical direction as indicated by arrow 123. Prior to reaching the first edge 124 of square 121, the high speed shutter system 74 shutters the beam 54 closed, preventing beam 64 from exposing resin 56. When focal point 65 of beam 64 is scanned to the first edge 124 of square 121, the high speed shutter system 74 opens the shutter, and beam 64 begins exposing resin 56. Because the focal point 65 of beam 64 is already being scanned before exposure of resin 56 begins, the focal point 65 may already be scanning at the desired substantially constant velocity. Thus, the beam 64 power may be maintained at a substantially constant value to maintain a substantially constant voxel size. Additionally, instead of sharply changing the direction focal point 65 of beam 64 scans at each corner, such as corner 125, high speed shutter system 74 closes the shutter when focal point 65 reaches the second edge 126 of the square 121. The shuttered focal point 65 is then scanned in a substantially circular pattern until it is substantially perpendicular to third edge 128 of square 121, where the scanning path of focal point 65 is straightened. The high speed shuttering system 74 then unshutters beam 64 when focal point 65 reaches third edge 128, and exposure of the second side 129 of square 121 begins. A similar process occurs when turning focal point 65 of beam 64 to expose the other sides of square 121.

Figure 13:
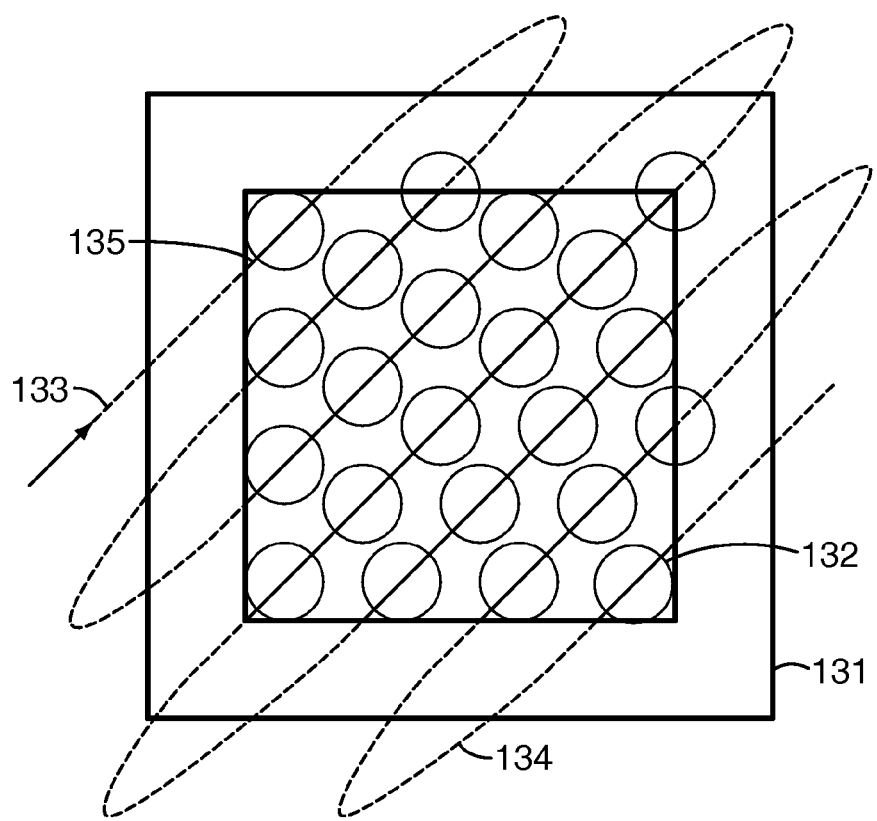
FIG. 13 is a diagram illustrating an exemplary method of forming an interior of a structure using multiphoton curing.
Figure 14:
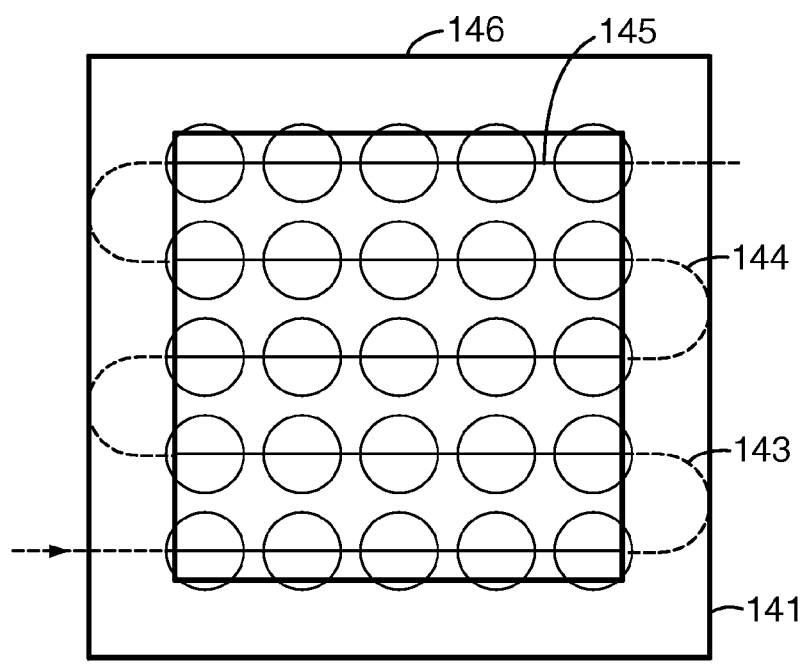
FIG. 14 is a diagram illustrating another exemplary method forming an interior of a structure using multiphoton curing.

FIGS. 13 and 14, then, illustrate exemplary methods that may be used to at least partially cure the interior of a square 131, which may be similar to square 121. Once again, the high speed shuttering system 74 is used to shutter and unshutter beam 64 to expose and prevent exposure of resin 66 to beam 64 in desired exposure patterns. In FIG. 13, this exposure pattern 133 is cross-hatched (i.e., diagonal to the square 131). Similar to FIG. 12, the power of the beam 64 is held substantially constant, as indicated by the circles 132 of constant radius. The high speed shuttering system 74 is used to shutter the beam 64 at positions where it is not desired that the beam 64 exposes the resin 56, which are illustrated by dashed lines 134. The high speed shuttering system unshutters beam 64 in positions where exposure of resin 66 by beam 64 is desired, indicated by solid lines 135. Again similar to FIG. 12, the scanning velocity of focal point 65 is substantially constant within the interior of the square 131.

FIG. 14 illustrates another exemplary pattern 143 of exposure of the interior of a square 141. Instead of the cross-hatched exposure pattern 133 of FIG. 13, the exposure pattern 143 of FIG. 14 is substantially parallel to side 146 of square 141. Again, the power and scan velocity of beam 64 is substantially constant within the interior of square 141, and the high speed shuttering system 74 is used to shutter (illustrated by dashed lines 144) and unshutter (illustrated by solid lines 145) beam 64 to expose only the desired areas of resin 66.

Methods similar to those described with reference to FIGS. 12, 13, and 14 may be used to at least partially cure structures of any desired shape, including lines, planes, curved surfaces, and more complex structures comprising more than one line, plane, and/or curved surface. The methods may also be implemented without first curing an outer boundary of the desired shape. For example, the desired shape or region of cure including one or more boundary may first be defined, followed by utilizing a high speed shuttering method similar to those outlined above.

High speed shuttering methods such as those described may also be useful to decrease the time required to at least partially cure structures (i.e., to increase throughput). The use of high speed shuttering may allow the use of a substantially constant scanning velocity, which obviates the need for acceleration and deceleration of the focal point 65. While the time spent on each individual acceleration or deceleration of the focal point 65 may be relatively short, the cumulative time spent accelerating and decelerating focal point 65 when at least partially curing a complex structure may constitute a large portion of the time necessary to cure the structure. Decreasing the time spent accelerating and decelerating the focal point 65, then, may reduce the amount of time required to at least partially cure the structure.

Figure 15:
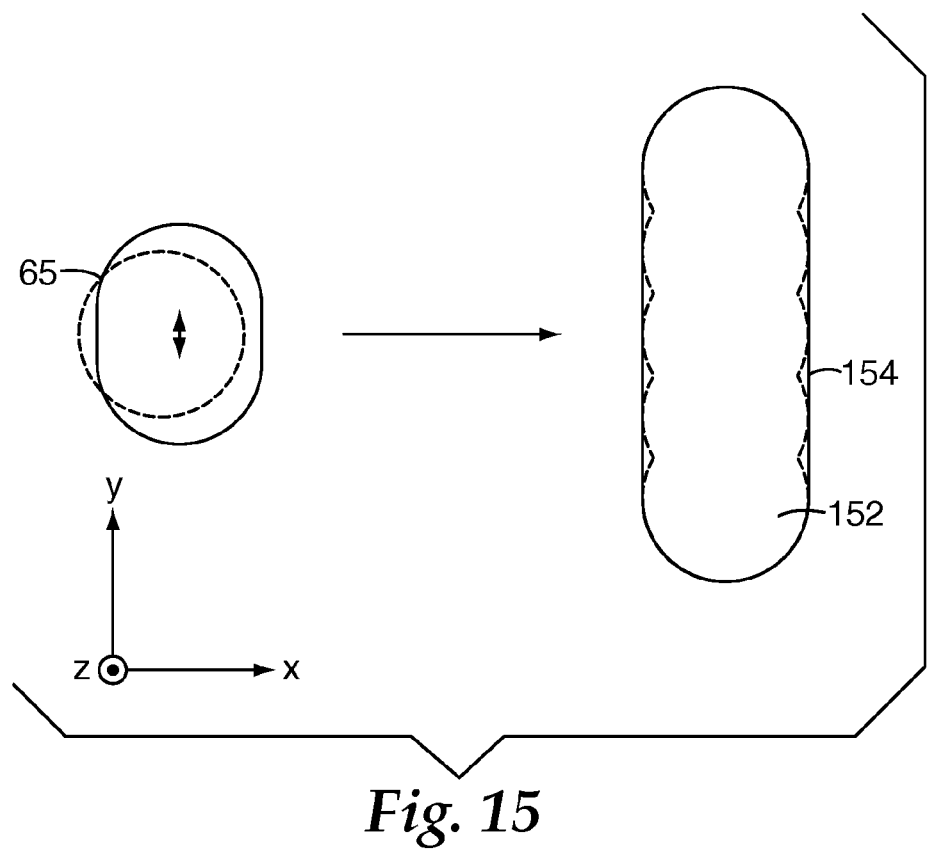
FIG. 15 is a diagram illustrating an exemplary method of forming edges with less surface roughness using multiphoton curing.

As described above, control module 63 may control the position of the focal point 65 of beam 64 to high precision. This precise positional control may be used to dither the beam, which may decrease edge roughness, and thus improve edge definition. Dithering is a technique including introducing random noise into a signal, which in this case is the position of the focal point 65 of the beam 64. Put another way, the focal point 65 of the beam 64 is vibrated, which may occur in one axis (the y-axis), as illustrated in FIG. 15, or may occur in two or even three axes. Dithering the beam may effectively increase the size of the at least partially cured voxel parallel to the dither axis, while maintaining the voxel size in the undithered axis or axes.

Dithering may also be introduced using the HWP/galvanometer and polarizer combination or the Pockels cell and polarizer combination described above. For example, the real-time power control afforded by these combinations may be used to quickly change the size of the at least partially cured voxel. By quickly changing the size to be larger and smaller, either in a periodic or random manner, a similar effect to positional dithering may be achieved.

Dithering either the position of the focal point of the size of the at least partially cured voxel may be particularly advantageous when curing a surface of a structure, such as a plane 152, as illustrated in FIG. 15. Plane 152 is similar to plane 20 of FIG. 2, and is formed by scanning beam 64 in five partially-overlapping scan lines in the z-axis. As can easily be seen, dithering the focal point 65 of beam 64 in the y-axis produces a plane 152 that has a much lower surface roughness, or better edge definition. Specifically, the depressions 28 present in plane 20 of FIG. 2 have been substantially smoothed, which results in a smoother surface 154.

Figure 16:
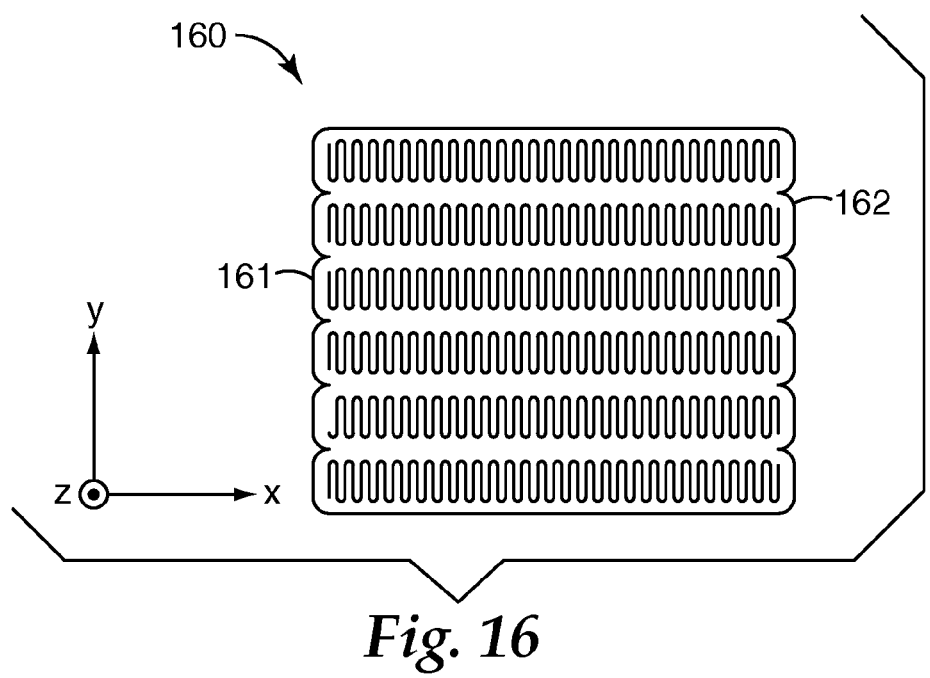
FIG. 16 is a side view of a structure formed using a method similar to that of FIG. 15.
Figure 17A:
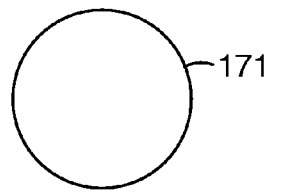
FIGS. 17A-E are five cross-sectional views of exemplary beam shapes.
Figure 17B:
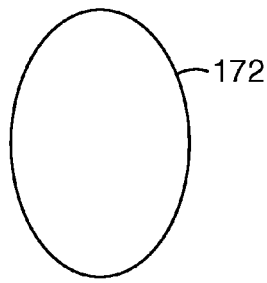
Figure 17C:
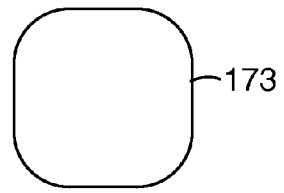
Figure 17D:
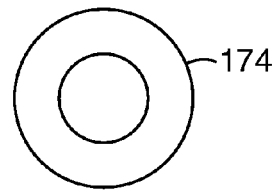
Figure 17E:
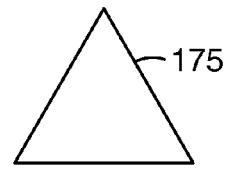

In some embodiments, dithering may be preferable to utilizing a smaller focal point 65 because the structure may be formed more quickly (i.e., to increase throughput). Turning now to FIG. 16 and returning again to the cube example, similar to those shown in FIGS. 4A and 4B, a cube 160 with smoother surfaces 161, 162 may be formed using a dithered focal point 65 of beam 64. Cube 160 includes six layers, similar to the cube 40a in FIG. 4A, but has smoother surfaces 161, 162 due to the dithering of focal point 65. The surface roughness of surfaces 161, 162 may be further decreased by dithering the beam more in the y-axis, by overlapping a greater portion of the at least partially cured voxels (in the y-axis), by decreasing the size of the focal point 65, other techniques, or by a combination of these two or more of these techniques.

In embodiments, dithering of focal point 65 of beam 64 may only be desired or necessary at or near the surfaces of a structure. In these embodiments, the focal point 65 may be dithered at or near the surface of a volume that comprises the structure, while the focal point 65 is not dithered while scanning the volume of the structure.

Another method useful for improving the edge definition of a structure formed by multiphoton curing includes spatial modulation of the focal point. Spatial modulation may be accomplished in optical system 61 using a variety of modules including, for example, a liquid crystal display (LCD) modulator, power control modules such as Pockels cell/polarizer or HWP/polarizer combinations, dithering, or the like. An LCD modulator may comprise a plurality of liquid crystal pixels that may be aligned to allow or disallow a portion of beam 64 incident on the pixel to be transmitted. By arranging the transmission pattern of the LCD, a shape or pattern may be introduced into beam 64. Cross-sectional shapes introduced into focal point 65 of beam 64 may include those shown in FIGS. 17A-E, for example, a circle 171, an ellipse 172, a rounded rectangle 173, a donut shape 174, a triangle 175, other geometric shapes, and the like. The LCD modulator may also affect only the phase of the beam 64 and not the power of beam 64, which may allow change of the shape of focal point 65 of beam 64 without changing the total power of beam 64.

Figure 18:
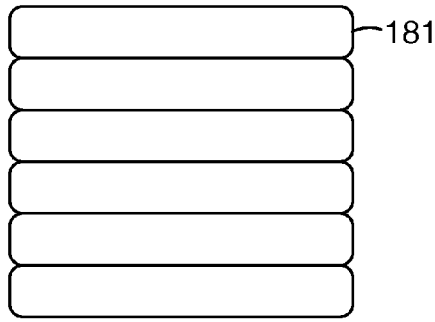
FIG. 18 is a side view of a cube formed using a focal point with a rounded rectangular cross-section.

Spatial modulation may improve edge definition by affecting the shape of the at least partially cured voxel. For example, FIG. 18 shows a side view of a cube 181 that demonstrates how using a rounded rectangle shape 173 may allow the formation of a cube 181 with a lower surface roughness. The cube 181 includes six layers, similar the cube 40a shown in FIG. 4A and cube 160 of FIG. 16. However, the surface roughness is decreased, and edge definition is increased because of the rounded rectangle shape 173 of the focal point 65.

Figure 19:
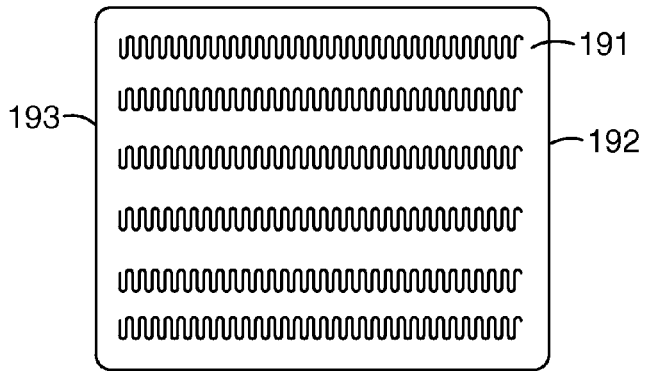
FIG. 19 is a side view of a cube formed using a dithered focal point with a rounded rectangular cross-section.

Combining spatial modulation with dithering of focal point 65 may further reduce surface roughness and improve edge definition. FIG. 19 illustrates a side view of an exemplary cube 191 including six layers formed by a rounded rectangle shaped 173 focal point 65 that has been dithered while the focal point 65 is scanned. The combination of the rounded rectangle shaped 173 focal point and dithering has resulted in a cube 191 with substantially smooth surfaces 192, 193. Once again, the amount of dithering in each axis may be tailored to provide the desired surface roughness.

Each of the above-describe methods may be combined with one or more of the other described methods to produce further improvements in an edge definition of structures formed by multiphoton curing. For example, dithering focal point 65 may be combined with real-time power control and advanced writing strategies to increase edge definition. Other combinations are also possible, such as dithering an elliptical beam primarily along its major axis.

The methods and apparatuses described herein may also find application in increasing throughput (i.e. decreasing the amount of time necessary to at least partially cure a structure) of a multiphoton curing system. Increased throughput may be especially desirable when fabricating arrays of structures, when fabricating complex structures, or both. For example, real-time power control may allow control of the size of focal point 65 to define small voxels for fine features, while enabling focal point 65 to be enlarged to efficiently cure larger features. Additionally, dithering may be used to increase the voxel size in one or more axis while maintaining the voxel size in one or more other axis. This may be desired when defining structures with one or more dimension that is larger than one or more other dimension (e.g., a plane).

Various embodiments of the invention have been described. These and other embodiments are within the scope of the following claims.

What is claimed is:

1. A method comprising:
   scanning a radiation beam with respect to a multiphoton curable photoreactive composition, wherein the radiation beam comprises a power sufficient to at least partially cure a volume of the multiphoton curable photoreactive composition; and
   modifying a characteristic of the radiation beam as the radiation beam is scanned.

2. The method of claim 1, wherein modifying the characteristic of the radiation beam alters an edge definition of a structure.

3. The method of claim 1, wherein modifying the characteristic of the radiation beam comprises modifying a power of the beam.

4. The method of claim 3, wherein modifying the characteristic of the radiation beam further comprises:
   measuring a power of the radiation beam;
   comparing the measured power of the radiation beam to a desired power of the radiation beam; and
   changing the power of the radiation beam so that the measured power of the radiation beam is substantially equal to the desired power of the radiation beam.

5. The method of claim 3, wherein modifying the characteristic of the radiation beam comprises modifying a power of the radiation beam to maintain a substantially constant at least partially cured voxel size.

6. The method of claim 3, wherein modifying the power of the radiation beam comprises modifying a power of the radiation beam in response to a change in a scanning velocity of a focal point of the radiation beam.

7. The method of claim 1, wherein modifying the characteristic of the radiation beam comprises modifying a scan velocity of the beam.

8. The method of claim 1, wherein modifying the characteristic of the radiation beam comprises dithering the radiation beam in at least one axis.

9. The method of claim 1, wherein modifying the characteristic of the radiation beam comprises a spatial modulation of a focal point of the beam.

10. The method of claim 1, wherein modifying the characteristic of the radiation beam lowers a surface roughness of a structure.

11. The method of claim 1, wherein modifying the characteristic of the radiation beam comprises shuttering the beam when an edge of a structure is reached.

12. A method comprising:
   scanning a focal point of a radiation beam within a multiphoton curable photoreactive composition to at least partially cure a volume of the multiphoton curable photoreactive composition via multiphoton absorption;
   measuring a power of at least a portion of the radiation beam while the focal point is scanned;
   comparing the measured power of the at least a portion of the radiation beam with a desired power of the radiation beam; and
   adjusting the power of the radiation beam while the focal point is scanned based on a difference between the measured power and desired power.

13. The method of claim 12, wherein scanning a focal point of a radiation beam comprises changing a scanning velocity of the focal point of the radiation beam, and wherein the desired power of the radiation beam changes as the scanning velocity changes.

14. The method of claim 12, wherein adjusting the power of the radiation beam further comprises adjusting the power of the radiation beam to maintain a substantially constant voxel size.

15. A method comprising:
scanning a focal point of a radiation beam with respect to a multiphoton curable photoreactive composition, wherein the radiation beam comprises a sufficient power to at least partially cure a volume of the multiphoton curable photoreactive composition proximate the focal point; and
dithering the focal point of the radiation beam along at least one axis while the focal point is scanned.

16. The method of claim 15, further comprising:
modifying the power of the radiation beam as the focal point of the radiation beam is scanned.

17. The method of claim 15, wherein dithering the focal point of the radiation beam comprises dithering the focal point of the radiation beam when scanning the focal point along or near a surface of a predetermined volume but not dithering the focal point of the radiation beam when scanning in the volume.

18. A method comprising:
specifying a region comprising a border in a multiphoton curable photoreactive composition;
scanning a radiation beam with respect to the multiphoton curable photoreactive composition within the specified region, wherein the radiation beam comprises a power sufficient to at least partially cure a volume of the multiphoton curable photoreactive composition;
scanning the radiation beam past the border and out of the specified region;
shuttering the radiation beam once the radiation beam is outside the specified region; and
scanning the radiation beam past the border and into the specified region, wherein the radiation beam is unshuttered once the radiation beam is within the specified region, wherein the scan velocity of the radiation beam is not changed as the beam is scanned past the border.

* * * * *